US007106640B2

(12) United States Patent
Yoon et al.

(10) Patent No.: US 7,106,640 B2

(45) Date of Patent: Sep. 12, 2006

(54) SEMICONDUCTOR MEMORY DEVICE CAPABLE OF DETECTING REPAIR ADDRESS AT HIGH SPEED

(75) Inventors: Seok-Cheol Yoon, Ichon-shi (KR); Jae-Jin Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/024,902

(22) Filed: Dec. 30, 2004

(65) Prior Publication Data

US 2005/0226065 A1 Oct. 13, 2005

(30) Foreign Application Priority Data

Jan. 9, 2004 (KR) ..................... 10-2004-0001582

(51) Int. Cl.
*G11C 7/00* (2006.01)

(52) U.S. Cl. ...................................... 365/200; 365/201

(58) Field of Classification Search ................ 365/200, 365/201
See application file for complete search history.

(56) References Cited

U.S. PATENT DOCUMENTS 6,285,620 B1 * 9/2001 Ho et al. ................. 365/225.7
6,404,683 B1 * 6/2002 Yumoto ...................... 365/200

FOREIGN PATENT DOCUMENTS

KR 1020020030183 4/2002

* cited by examiner

*Primary Examiner*—M. Tran
(74) *Attorney, Agent, or Firm*—Mayer, Brown, Rowe and Maw LLP

(57) ABSTRACT

There is provided a semiconductor memory device capable of detecting a repaired address in a test mode. The semiconductor memory device includes: a plurality of unit address detectors for comparing 1-bit address signal with a stored 1-bit repair address signal to output a repair signal, and for buffering the stored repair address signal and outputting the buffered repair address signal as the repair signal in a test mode; a redundancy address detector for combining the plurality of repair signals from the unit address detectors and outputting a detection signal for detecting whether a current input address is a redundancy address; and a redundancy flag signal generator for generating a redundancy flag signal in response to the detection signal and transferring the redundancy flag signal to a data output path.

13 Claims, 10 Drawing Sheets

10
10a
FUSE BOX
yra1
10b
ADDRESS LATCH BLOCK
bya1
10c
ADDRESS COMPARATOR
11
12
13
A0
A1
A2
A8
hit1
hit2
hit3
hit9
20
REDUNDANCY ADDRESS DETECTOR
en
syeb1
30
REDUNDANCY FLAG SIGNAL GENERATOR
tm_rcall
syeb2
syeb3
syeb4
flag 500
530
510
520
B1
B2
I22
I31
ND14
ND15
Int0
Int1
/Int0
Int
/Int0
Int1
/Int1
tm_read
init
VSS
T5
T6
T7
T8
I16
I17
I18
I19
I20
I21
I23
I24
I25
I26
I27
I28

SEMICONDUCTOR MEMORY DEVICE CAPABLE OF DETECTING REPAIR ADDRESS AT HIGH SPEED

FIELD OF THE INVENTION

The present invention relates to a semiconductor memory device; and, more particularly, to a semiconductor memory device which can be effectively detecting a repaired address.

DESCRIPTION OF RELATED ART

In a manufacture of a semiconductor memory device, even when only one cell among normal cells is defective, a semiconductor memory device is treated as a defective product because it cannot perform a memory function. However, it is inefficient in view of yield.

Accordingly, one method of improving the yield is to replace the detective cell with the redundancy cell.

In a repair process using the redundancy cell, spare rows and spare columns are in advance provided at every predetermined cell array and the defective cell is replaced with the redundancy cell of a row/column unit.

In more detail, after a wafer process is completed, a detective cell is detected by a test and a program of replacing a corresponding address with a redundancy address is performed within an internal circuit. Accordingly, in an actual use, if the address signal corresponding to the defective cell is inputted, the defective cell is replaced with the redundancy cell.

A most widely used method is to change an address path by using a laser beam to cut off a fuse.

FIG. 1 is a block diagram of a conventional semiconductor memory device.

Referring to FIG. 1, the conventional semiconductor memory device includes unit repair circuits 10 to 13, a redundancy address detector 20, and a redundancy flag signal generator 30.

The unit repair circuits 10 to 13 compare 1-bit address signals A0 to A8 with a repaired address signal. The redundancy address detector 20 combines unit repair signals hit1 to hit9 outputted from the unit repair circuits 10 to 13 and outputs a redundancy detection signal syeb1. The redundancy flag signal generator 30 receives the redundancy detection signals syeb1 to syeb4 and generates a flag signal flag.

The unit repair circuit 10 for repairing 1-bit address signal includes a fuse box 10*a* for outputting a repair address signal yra1 according to a blowing of a fuse, an address latch 10*b* for latching an address inputted from an exterior, and an address comparator 10*c* for comparing the repair address signal yra1 with the latched address signal bya1 to output the unit repair signal hit1.

FIG. 2 is a circuit diagram of the fuse box shown in FIG. 1.

Referring to FIG. 2, the fuse box 10*a* includes a fuse f, a MOS transistor MP1 having a gate receiving an enable signal enable and connecting a power supply voltage VDD to one terminal of the fuse f, a MOS transistor MN1 having a gate receiving a fuse select signal fs1 and connecting a ground voltage VSS to the other terminal of the fuse f, latch inverters I1 and I2 for latching a signal applied on one terminal of the fuse f, and an output inverter I3 for outputting an inverted output of the latch inverters.

FIG. 3 is a circuit diagram of the address comparator 10*c* shown in FIG. 1.

Referring to FIG. 3, the address comparator 10*c* outputs the unit repair signal hit1 of a high level when the repair address signal yra1 and the latched address signal bya1 have the same level, and outputs the unit repair signal hit1 of a low level when the repair address signal yra1 and the latched address signal bya1 have the different level from each other.

FIG. 4 is a circuit diagram of the redundancy address detector shown in FIG. 1.

Referring to FIG. 4, the redundancy address detector 20 outputs the redundancy detection signal syeb1 of a low level only when all the unit repair signals hit1 to hit9 from the unit repair circuits 10 to 13 are activated to a high level. Here, the redundancy detection signal syeb1 is a signal for detecting a repair with respect to one address. Accordingly, the number of the redundancy address detectors provided as many as the number of repair addresses is determined.

The enable signal en is a signal for enabling the redundancy address detector 20. If the enable signal en of a low level is inputted, the redundancy detection signal syeb1 of a high level is outputted without regard to the active states of other unit repair signals.

FIG. 5 is a circuit diagram of the redundancy flag signal generator 30 shown in FIG. 1.

Referring to FIG. 5, the redundancy flag signal generator 30 combines the redundancy detection signals syeb1 to syeb4 outputted from the redundancy address detector and generates the flag signal. When a test mode signal tm_rcall is activated to a high level, if at least one of the redundancy detection signals syeb1 to syeb4 is activated to a low level, the flag signal of a high level is activated and outputted.

The remaining circuit shown in FIG. 5 is a circuit showing a part of a data output path of the semiconductor memory device. In a test mode where the test mode signal tm_rcall of a high level is inputted, the redundancy flag signal flag is outputted through a data output line gio to an exterior of the semiconductor memory device. Meanwhile, in a normal state where the test mode signal tm_rcall of a low level is inputted, a data signal iost transferred from a core area is outputted through a data output line to an exterior.

Accordingly, if the flag signal of a high level is outputted to an exterior of the semiconductor memory device in the test mode, it means that a data access occurs in the repaired address.

A test process of the conventional semiconductor memory device will be described with reference to FIGS. 1 to 5.

First, unit cell is tested in a wafer level. At this point, a repair process is performed by selectively irradiating a laser to blow a fuse of the fuse box, which corresponds to an address of a defective unit cell.

When an address of the defective unit cell is inputted, the redundancy detection signal syeb1 is activated and outputted. Then, the defective unit cell is replaced with the redundancy unit cell.

After the repair process of blowing the fuse in the wafer level, all the unit cells are tested. If there is no error in all the unit cells, a package process is performed.

Then, in the packaged state, a data access test is performed on all the unit cells. During that process, an error in the data access may occur. In order to know whether the error occurs in the package process or there is a problem in the repair circuit, a test must be again performed.

In a state where the test mode signal is activated and inputted, the address signals A0 to A8 are inputted sequentially. If the flag signal flag is outputted during the input of the address signals A0 to A8, it means that the semiconductor memory device correctly detects the repaired address.

Accordingly, if a total number of the addresses are nine (A0 to A8), the addresses must be inputted $2^N$ times in order to output the flag signal flag. Consequently, an entire test time is increased.

FIG. 6 is a waveform showing an operation of testing the semiconductor memory device shown in FIG. 1.

In FIG. 6, when an active command ACT is inputted, a row address X(i) is inputted and a column address Y(0) is sequentially increased in response to a read command RD. At this point, an address (that is, a repaired address) is found when the flag signal is outputted. As described above, the flag signal is outputted through a data output pin DQ. Therefore, in order to detect the repaired address, the read command for the nine column addresses must be inputted 512 times.

The repaired address can be recognized in the repair of the wafer level. However, hundreds of the memory devices are manufactured on one wafer and a lot of wafers are continuously manufactured. Also, a lot of the memory devices are continuously packaged. Therefore, it is very difficult to separately store the repair information and use the repair information in the test process.

Accordingly, the conventional semiconductor memory device has a problem in that the address accessing the redundancy cell cannot be easily detected in the package state.

SUMMARY OF THE INVENTION

It is, therefore, an object of the present invention to provide a semiconductor memory device capable of detecting a repaired address in a test mode.

In accordance with an aspect of the present invention, there is provided a semiconductor memory device including: a repair address storing unit for storing 1-bit repair address signal; and an address comparing unit for comparing an address signal with the repair address signal to output a repair signal, and for buffering the repair address signal to output the repair signal in a test mode.

In accordance with another aspect of the present invention, there is provided a semiconductor memory device including: a plurality of unit address detectors for comparing 1-bit address signal with a stored 1-bit repair address signal to output a repair signal, and for buffering the stored repair address signal and outputting the buffered repair address signal as the repair signal in a test mode; a redundancy address detector for combining the plurality of repair signals from the unit address detectors and outputting a detection signal for detecting whether a current input address is a redundancy address; and a redundancy flag signal generator for generating a redundancy flag signal in response to the detection signal and transferring the redundancy flag signal to a data output path.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 7:
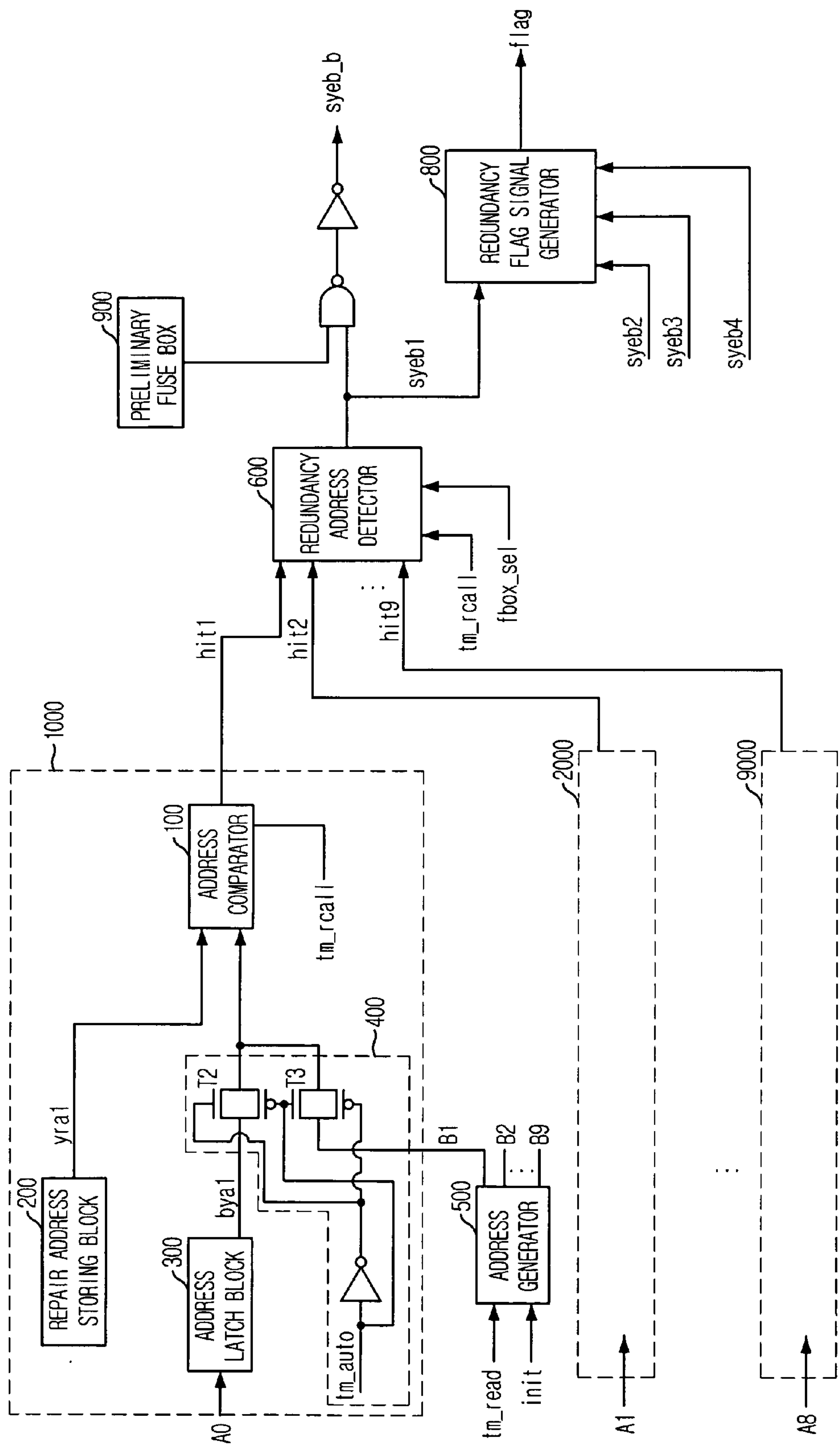
FIG. 7 is a block diagram of a semiconductor memory device in accordance with a preferred embodiment of the present invention.

FIG. 7 is a block diagram of a semiconductor memory device in accordance with a preferred embodiment of the present invention.

Referring to FIG. 7, the semiconductor memory device includes unit address detectors 1000 to 9000, a redundancy address detector 600, and a redundancy flag signal generator 800.

Each of the unit address detectors 1000 to 9000 compares 1-bit address signal (for example, A0) with 1-bit repair address signal (for example, yra1) and outputs a repair signal (for example, hit1). Also, each of the unit address detectors 1000 to 9000 buffers the repair address signal yra1 in response to a test mode signal tm_rcall and outputs it as the repair signal hit1. The redundancy address detector 600 combines the plurality of repair signals hit1 to hit8 outputted from the unit address detectors 1000 to 9000 and generates a redundancy detection signal syeb1 for detecting whether a current input address is a redundancy address or not. The redundancy flag signal generator 800 generates a redundancy flag signal flag by using the redundancy detection signal syeb1 and transfers it to a data output path. Here, in order to generate a plurality of redundancy detection signals syeb2 to syeb4 inputted to the redundancy flag signal generator 800, a plurality of unit address detectors and a plurality of redundancy address comparators are provided.

In addition, the semiconductor memory device further includes an address generator 500. The address generator 500 generates an address for inputting an address of a high level to only one selected unit address detector and inputting an address of a low level to the remaining unit address detectors. For example, the address generator 500 outputs a signal B1 of a high level to the unit address detector 1000 and outputs a signal B2 of a low level to the remaining unit address detectors 2000 to 9000.

While the test mode signal tm_rcall is activated in the test mode and inputted, if the address signal A0 is a low level, the address comparator 100 of the unit address detector 1000 outputs the repair signal hit1 of a high level. On the contrary, if the address signal A0 is a low level, the address comparator 100 buffers the stored repair address signal yra1 and outputs it as the repair signal hit1.

In addition, the unit address detector 1000 includes a repair address storing unit 200 for storing the repair address signal yra1, an address latch 300 for latching the inputted address A0, an address selecting unit 400 for selectively transferring the latched address signal bya1 and the signal B1 inputted from the address generator 500 in response to a test address select signal tm_auto, and an address comparing unit 100 for comparing the output signal of the address selecting unit 400 with the address signal yra1 stored in the address storing unit 200, buffering the stored address signal yra1 while the test mode signal is inputted in an activated state, and outputting the repair signal hit1.

The address selecting unit 400 includes a first transmission gate T2 and a second transmission gate T3. The first transmission gate T2 is turned on in response to the inactive test address select signal tm_auto and transfers the output signal of the address latch 300 to the address comparator 100. The second transmission gate T3 is turned on in response to the test address select signal tm_auto and transfers the output signal B1 of the address generator 500 to the address comparator 100.

The repair address storing unit 200 includes a fuse and outputs the repair address signal yra1 corresponding to the blowing of the fuse. If the fuse is blown, the repair address signal yra1 of a high level is outputted. If the fuse is not blown, the repair address signal yra1 of a low level is outputted.

Figure 8:
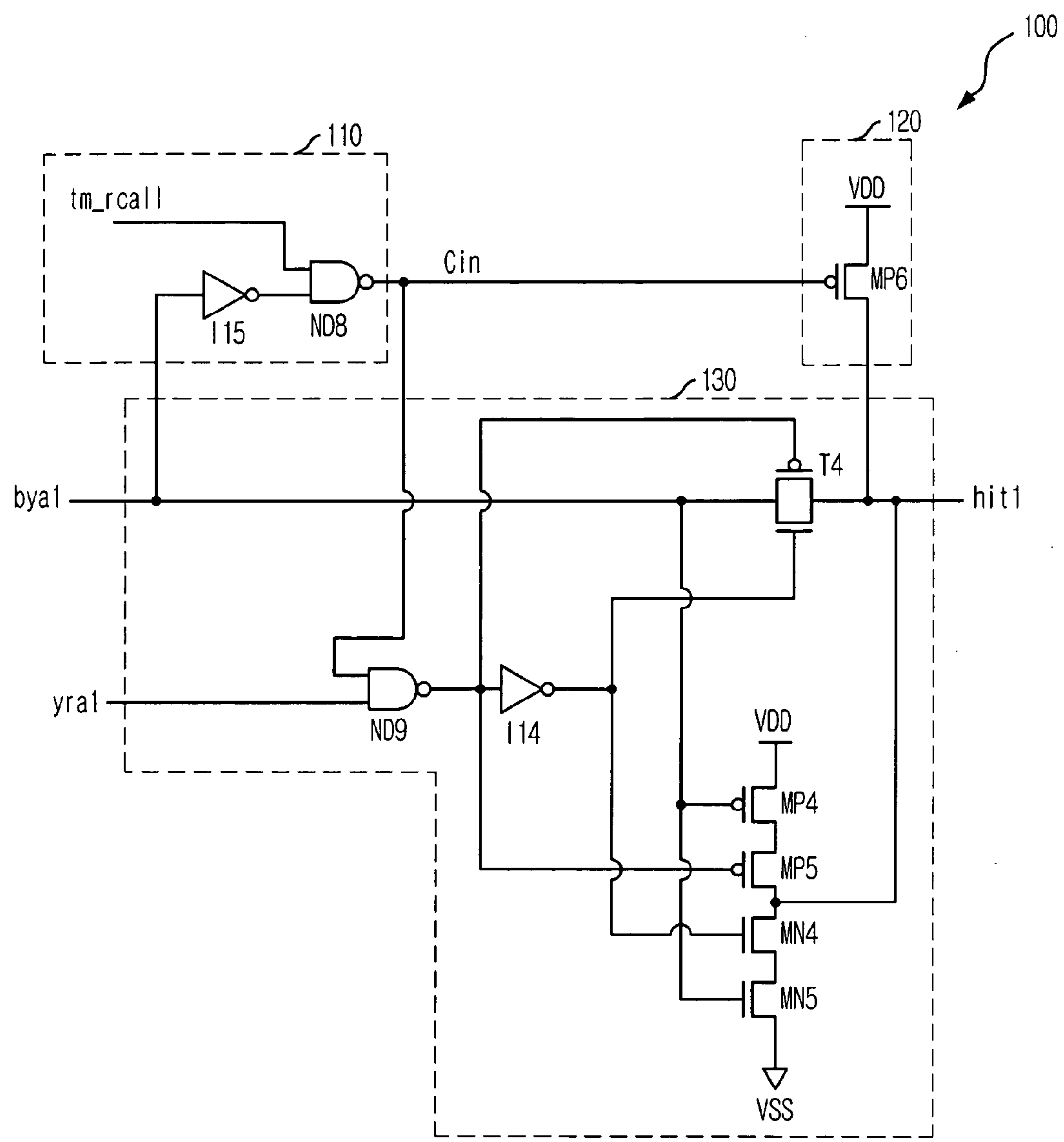
FIG. 8 is a circuit diagram of an address comparator shown in FIG. 7.

FIG. 8 is a circuit diagram of the address comparator 100 shown in FIG. 7.

Referring to FIG. 8, the address comparator 100 includes a logic combination unit 110, a signal transferring unit 120, and a comparator circuit 130.

The logic combination unit 110 combines the test signal tm_rcall activated in the test mode and the address signal of a high level and outputs an internal control signal Cin. The signal transferring unit 120 transfers the driving voltage VDD to an output terminal in response to the internal control signal Cin so as to activate the repair signal hit1. In case where the internal control signal Cin is in an inactive state, if the address signal bya1 and the repair address signal yra1 have the same level, the comparator circuit 130 activates the repair signal hit1 to a high level. In case where the internal control signal Cin is in an active state, the comparator circuit 130 buffers the repair address signal yra1 to output the repair signal hit1.

The logic combination unit 110 includes an inverter I15 for inverting the latched address signal bya1, and a NAND gate ND8 for receiving an output signal of the inverter I15 and the test signal tm_rcall to output the internal control signal Cin.

The signal transferring unit 130 includes a PMOS transistor MP6 serving as a driver. The PMOS transistor has a gate receiving the internal control signal Cin and transfers the power supply voltage VDD to the output terminal.

The comparator circuit 130 includes: a NAND gate ND9 receiving the internal control signal Cin and the repair address signal yra1; an inverter I14 for inverting an output signal of the NAND gate ND9; a transmission gate T4 turned on in response to the output signal of the NAND gate ND9 and the output signal of the inverter I14 to transfer the latched address signal bya1 to the output terminal; a PMOS transistor MP4 having a gate receiving an address signal and one terminal connected to the power supply voltage VDD; a PMOS transistor MP5 having a gate receiving the output signal of the NAND gate ND9 and one terminal connected to the other terminal of the PMOS transistor MP4; an NMOS transistor MN4 having a gate receiving the output signal of the inverter I14 and one terminal connected to the other terminal of the PMOS transistor MP5; and an NMOS transistor MN5 having a gate receiving the latched address signal bya1, one terminal connected to the other terminal of the NMOS transistor MN4, and the other terminal connected to the ground voltage VSS. A common node of the PMOS transistor MP5 and the NMOS transistor MN4 is connected to the output terminal and the repair signal hit1 is outputted through the output terminal.

Figure 9:
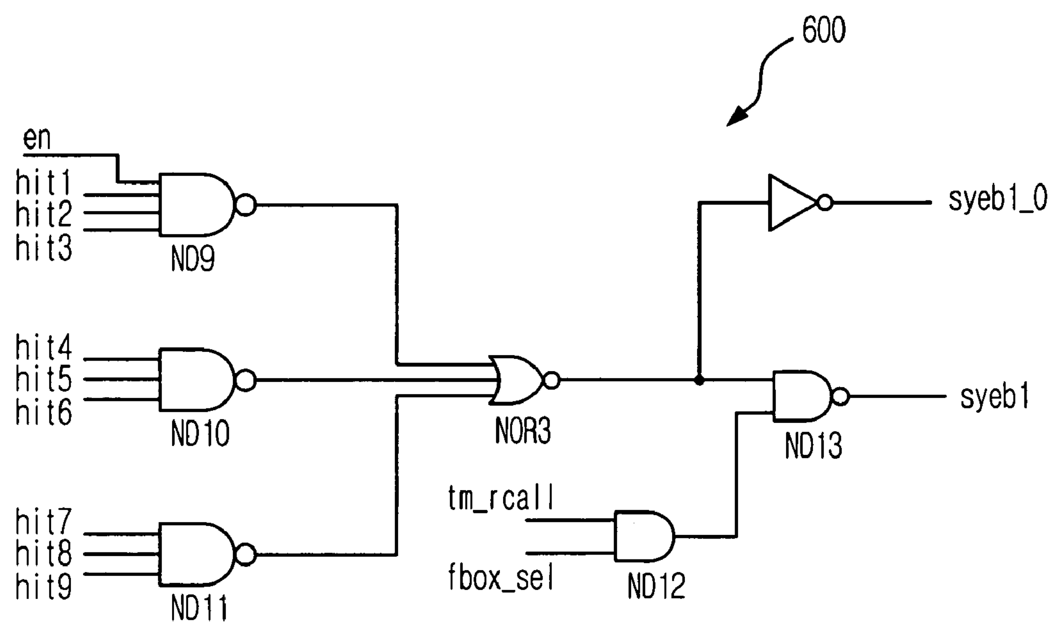
FIG. 9 is a circuit diagram of a redundancy address detector shown in FIG. 7.

FIG. 9 is a circuit diagram of the redundancy address detector 600 shown in FIG. 7.

Referring to FIG. 9, the redundancy address detector 600 includes: NAND gates ND9 to ND11 for receiving the enable signal en and the repair signals hit1 to hit9 outputted from the unit address detectors 1000 to 9000; a NOR gate NOR3 for receiving output signals of the NAND gate ND9 to ND11; a NAND gate ND12 for receiving the test mode signal rm_rcall and a select signal fbox_sel; a NAND gate ND13 for receiving an output signal of the NAND gate ND12 and an output signal of the NOR gate NOR3 to output the redundancy detection signal syeb1; and an inverter for inverting an output signal of the NOR gate NOR3 to output the redundancy detection signal syeb1_0.

A semiconductor memory device in accordance with another embodiment of the present invention further includes a plurality of redundancy address detectors (not shown) for generating a plurality of redundancy detection signals syeb2 to syeb4, which are outputted to the redundancy flag signal generator 800. The select signal fbox_sel is used to select one of the redundancy address detectors.

In this embodiment, the repaired addresses can be separately determined bit by bit. One of the redundancy address detectors is selected and activated using the select signal fbox_sel.

Also, the redundancy detection signal syeb1_0 is a signal for detecting the repaired address and replacing the defective cell with the redundancy cell. The redundancy detection signal syeb1 is a signal used to determine the address repaired in the test.

The redundancy flag signal generator 800 receives the redundancy detection signal syeb1 to output the flag signal flag. The flag signal flag is transferred through the data output path to the exterior. In the test mode, the flag signal flag is outputted through the data output path.

Figure 10:
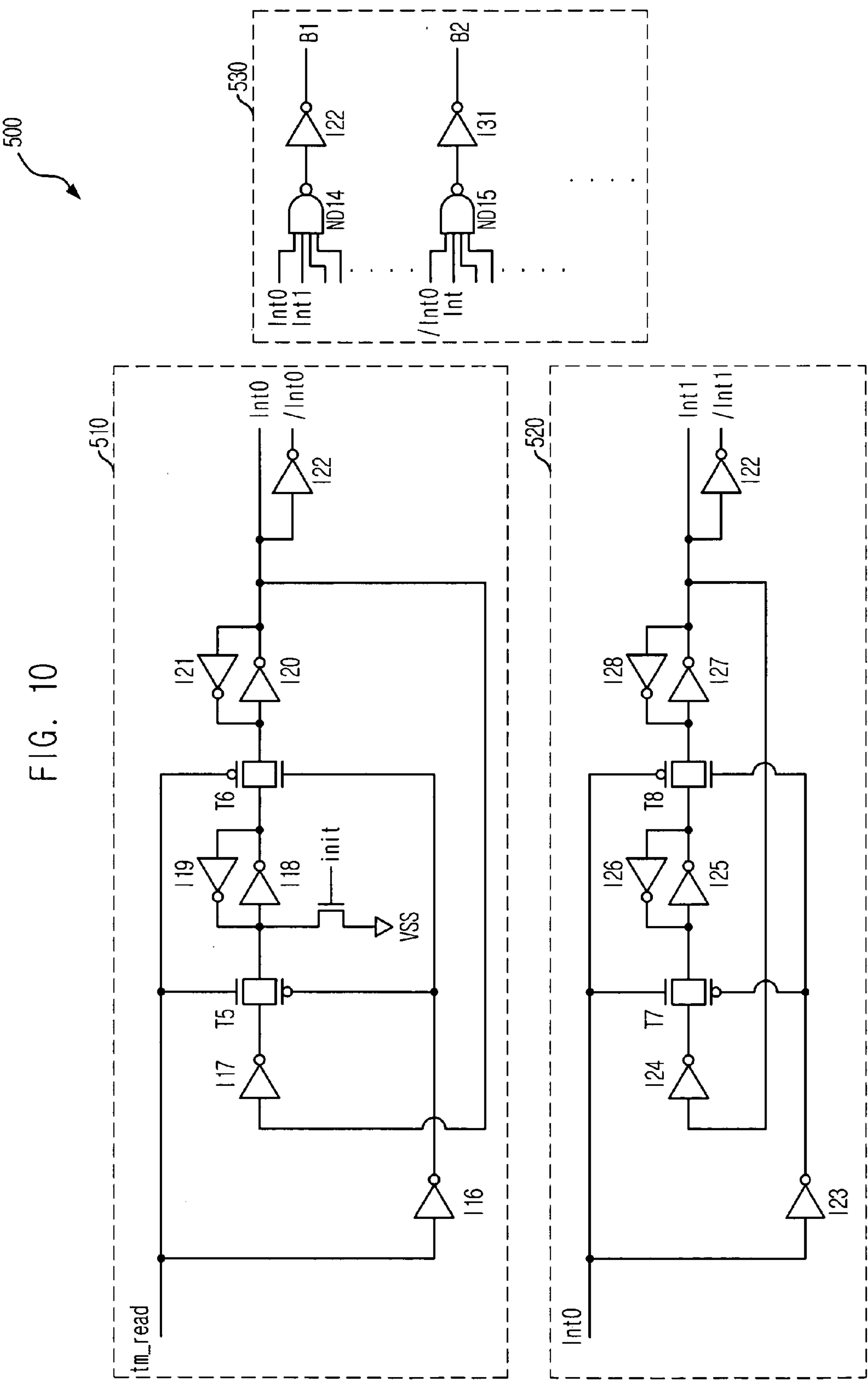
FIG. 10 is a circuit diagram of an address generator shown in FIG. 7.

FIG. 10 is a circuit diagram of the address generator 500 shown in FIG. 7.

Referring to FIG. 10, the address generator 500 inputs a high level signal to one of the unit address detectors 1000 to 9000 and a low level signal to the remaining unit address detectors. A plurality of reference signal generators 510 and 520 generate pulses int0 and int1 having various widths, and a signal combining unit 530 combines the pulses to output signals B1 and B2 to the unit address detectors 1000 to 9000.

Figure 11:
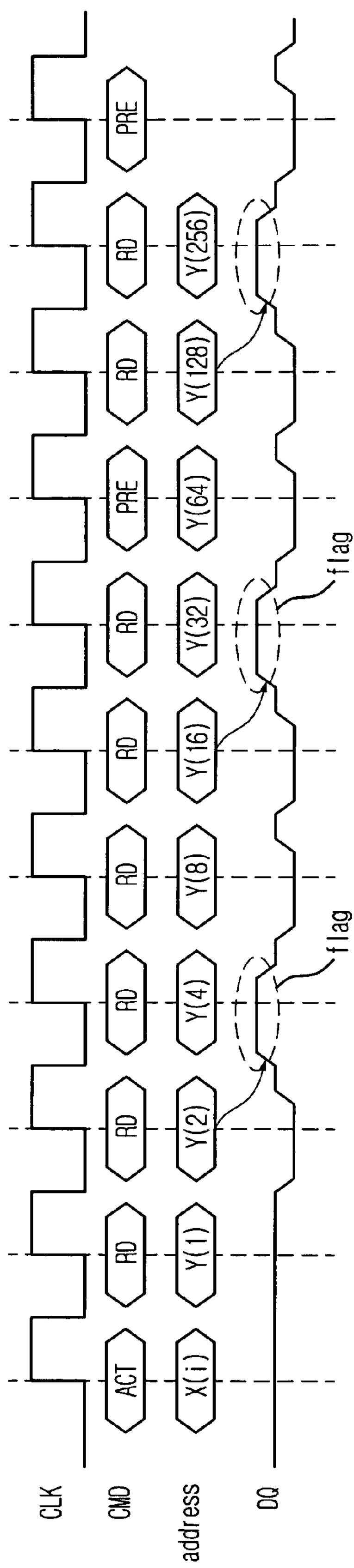
FIG. 11 is a waveform showing an operation of the semiconductor memory device shown in FIG. 9.
Figure 12:
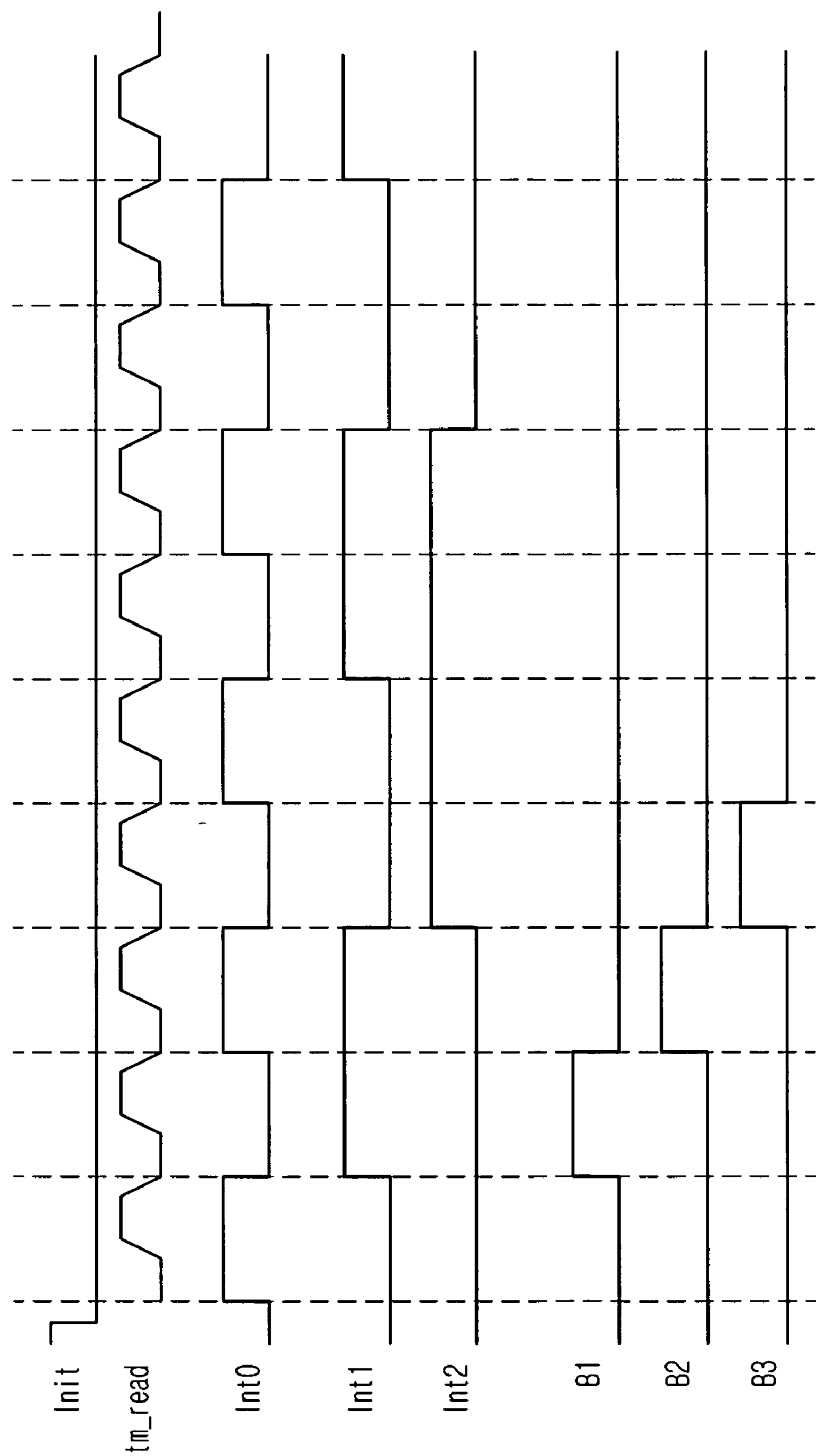
FIG. 12 is a waveform showing an operation of the address generator shown in FIG. 10.

FIGS. 11 and 12 are waveforms showing an operation of the semiconductor memory device in accordance with the present invention. An operation of the semiconductor memory device will be described with reference to FIGS. 7 to 12.

The semiconductor memory device includes the fuses and the detective cell is replaced with the redundancy cell. For this purpose, the fuse is selectively blown according to the address of the defective cell and the repaired address is stored. If the input address is equal to the repaired address, the redundancy detection signal syeb1 is outputted to notify that the address is the repaired address. Then, the defective cell is replaced with the redundancy cell in response to the redundancy detection signal syeb1.

The unit address comparator 100 stores 1-bit repaired address and activates the repair signal hit1 when the input address A0 is equal to the repaired address.

The repair address storing unit 200 stores the 1-bit repair address by the blowing of the fuse.

If the inactive test mode signal tm_rcall of a low level is inputted to the address comparator 100, the address comparator 100 compares the stored repaired address with the address bya1 latched by the address latch. If the repaired address and the latched address are equal to each other, the address comparator 100 activates the repair signal hit1 to a high level.

If the test mode signal tm_rcall of a high level is inputted to the address comparator 100, the repair signal hit1 is outputted in a different state according to the latched address signal bya1.

If the latched address signal bya1 is a high level, the PMOS transistor MP6 of the address comparator 100 is turned on, so that the repair signal hit1 is activated to a high level.

Figure 1:
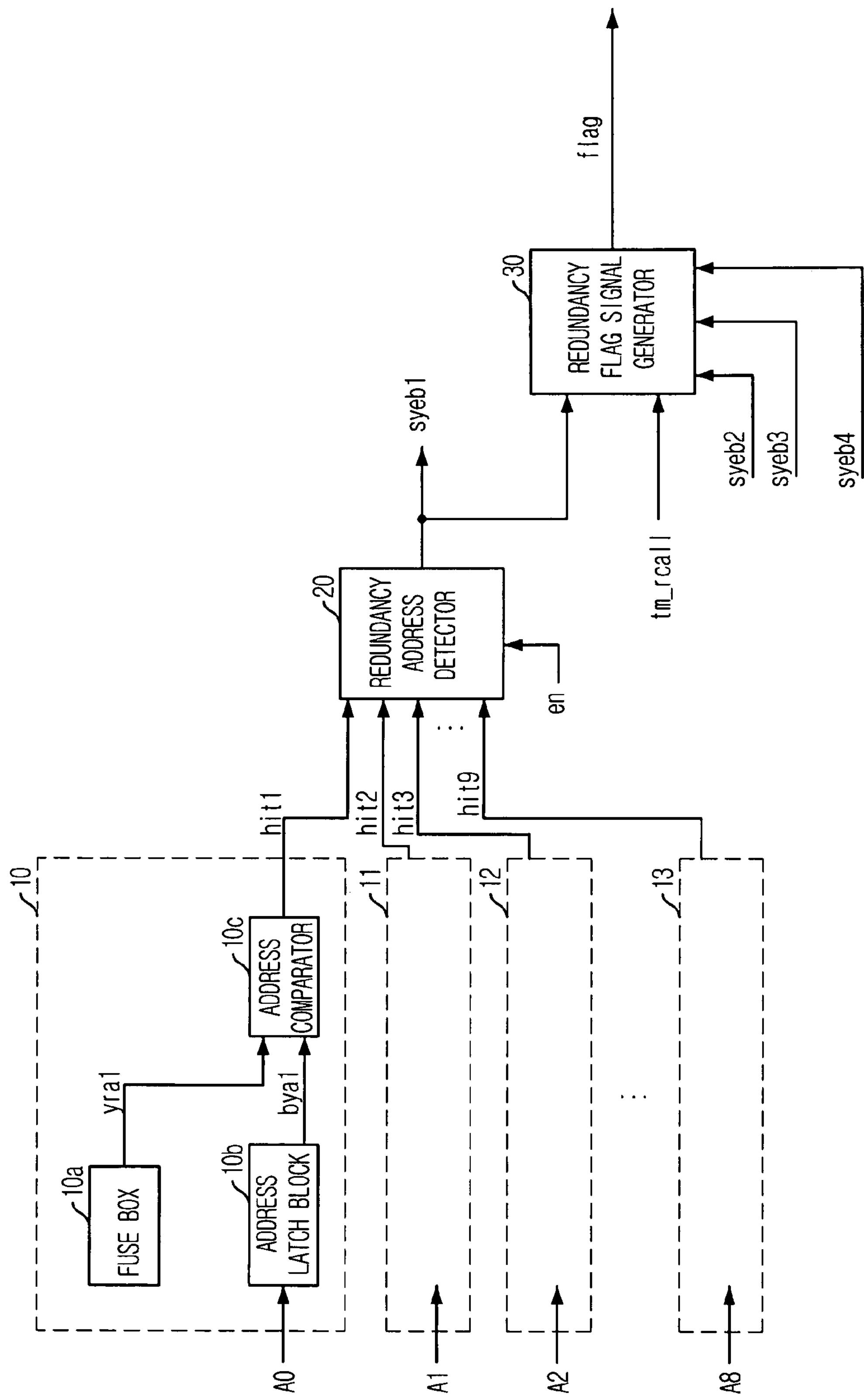
FIG. 1 is a block diagram of a conventional semiconductor memory device.
Figure 2:
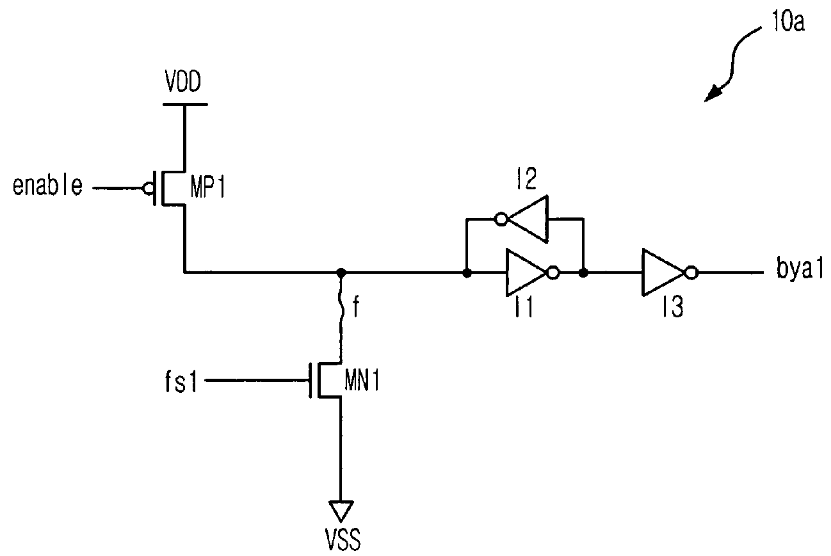
FIG. 2 is a circuit diagram of a fuse box shown in FIG. 1.
Figure 3:
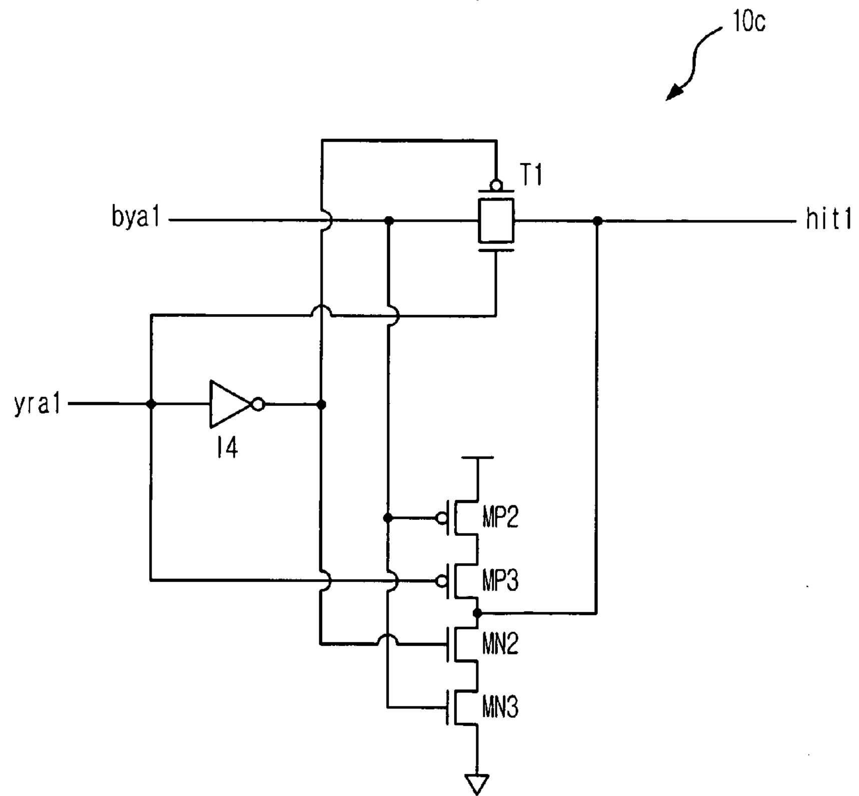
FIG. 3 is a circuit diagram of an address comparator shown in FIG. 1.
Figure 4:
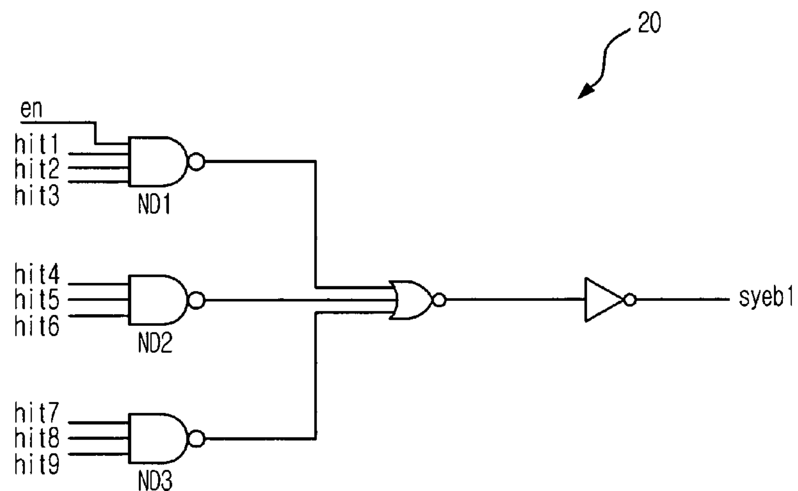
FIG. 4 is a circuit diagram of a redundancy address detector shown in FIG. 1.

In case where the test mode signal tm_rcall of a high level is inputted to the address comparator 100, if the latched address signal bya1 is a low level, the signal yra1 stored in the repair address storing unit 200 is buffered and outputted as the repair signal. That is, if the fuse (f, refer to FIG. 2) is blown and the signal yra1 stored in the repair address storing unit 200 is a high level, the repair signal hit1 is activated to a high level. On the contrary, if the fuse is not blown and thus the signal stored in the repair address storing unit 200 is a low level, the repair signal hit1 is deactivated to a low level.

In the test mode, the test mode signal of a high level is inputted and the address signal A0 of a high level is inputted to only one of the nine unit address detectors, while the address signals A1 to A8 of a low level are inputted to the remaining eight unit address detectors.

Accordingly, the repair signals hit2 to hit 9 outputted from the unit address detector receiving the address signal of low level are fixed to a high level, and the unit address detectors receiving the address signal of low level output the stored signal of the repair address storing unit 200 as the repair signal.

If the address signal of low level is inputted to only one unit address detector sequentially selected, the repaired address signal stored in the repair address storing unit can be determined.

In a state that the select signal fbox_sel and the test mode signal tm_rcall is all a high level, if the repair signals hit1 to hit9 are activated to a high level, the redundancy address detector 600 activates the redundancy detection signal syeb1 to a low level.

Here, the test mode signal tm_rcall is a signal activated in the test mode, and the select signal fbox_sel is a signal for selecting one of the redundancy address detectors. In this embodiment, the repair can be determined by comparing the repair address bit by bit. Therefore, it must be separately determined which bit signal of the repair address the current outputted repaired address signal is. For this, the select signal fbox_sel is inputted and one of the redundancy address detectors is selected.

Meanwhile, the redundancy address detector 600 outputs the redundancy detection signal syeb1_0 without regard to the select signal fbox_sel and the test mode signal tm_rcall. Using this signal, the data access controller of the semiconductor memory device determines that the corresponding address is the repaired address. Accordingly, the redundancy detection signal syeb1 is a signal for an external output in the test mode, and the redundancy detection signal syeb1_0 is a signal for determining that the corresponding address is the repaired address.

Figure 5:
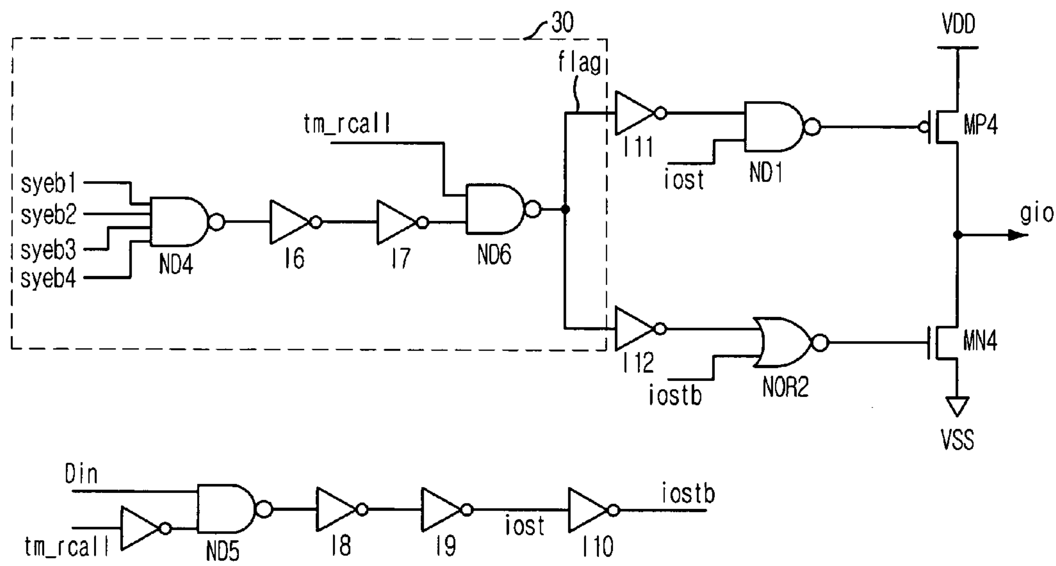
FIG. 5 is a circuit diagram of a redundancy flag signal generator shown in FIG. 1.
Figure 6:
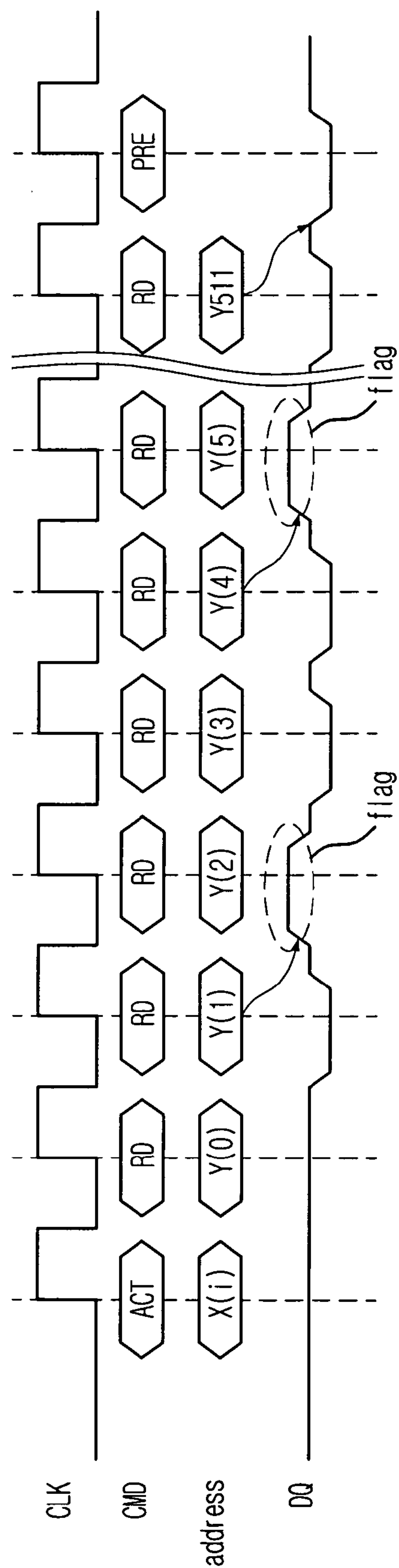
FIG. 6 is a waveform showing an operation of testing the semiconductor memory device shown in FIG. 1.

The redundancy flag signal generator 800 receives the redundancy detection signals syeb1 to syeb4 to output the flag signal flag. The flag signal flag is outputted through the data path to the exterior of the memory device (refer to FIG. 5).

It can be known that the input address signal is the repaired address signal by the flag signal outputted through the data output pin in the test.

FIG. 11 is a waveform showing an operation of the semiconductor memory device shown in FIG. 9.

Referring to FIG. 11, if the read command RD and the column addresses Y(1) to Y(246) are inputted in the active state by the active command ACT, the flag signal is outputted when the address is repaired.

According to the prior art, in case where the number of the column addresses are nine, the read command RD and the column address are inputted 512 times. However, according to the present invention, the state of the repaired address can be checked by nine times read operations. Also, it can be seen that the signal is correctly repaired or not. The reason is that the memory device in accordance with the present invention can know the bit-by-bit repair, that is, whether the fuse is blown or not. Accordingly, the repair address can be easily checked in the test.

In addition, if the repair address is inputted in the test, it can be checked whether the correctly repaired signal is outputted or not. Thus, an error can be easily traced.

FIG. 12 is a waveform showing an operation of the address generator 500 shown in FIG. 10.

The address generator 500 automatically generates the test addresses A0 to A8 in the test and inputs them to the respective unit address detectors 1000 to 9000. In the test, the address signal of a high level must be inputted to only one selected unit address detector and the address signal of a low level must be inputted to the remaining unit address detectors.

For this purpose, the plurality of reference signal generators 510 and 520 of the address generator 500 generate the pulses having the different periods.

The signal combining unit 530 combines the pulses and outputs the combined signal to the unit address detectors.

The output signal of the address generator 500 is transferred to the address comparator 100 through the transmission gate T3 turned on in response to the test address select signal tm_auto.

In FIG. 12, there are shown the pulses int0, int1 and int2 and three output signals B1, B2 and B3.

Meanwhile, the semiconductor memory device in accordance with the present invention further includes a redundancy fuse part 900 having redundancy fuses. If the fuse of the redundancy fuse part 900 is blown, the buffered redundancy detection signal syeb_b is always outputted in an inactive state.

In this case, the redundancy detection signal syeb_b cannot be used internally in the semiconductor memory device. At this point, it is used to store a chip ID.

The ID may include a position of a chip on the wafer, a wafer number, a lot number and so on. In case where the semiconductor memory device stores this information, the information can be used to easily trace the manufacturing procedures in the defect analysis. This is possible because the repair circuit of the semiconductor memory device can check the repaired address.

According to the present invention, the repair-related test time can be reduced to thereby shorten the development period of the semiconductor memory device.

Further, the redundancy fuse can be used to store the chip position, the wafer number and the lot number, such that the manufacturing procedure can be easily traced when the semiconductor memory device is defective.

The present application contains subject matter related to Korean patent application No. 2004-01582, filed in the Korean Patent Office on Jan. 9, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
- a repair address storing unit for providing 1-bit repair address signal;
- an address comparing unit for comparing an address signal with the 1-bit repair address signal to output a repair signal; and
- an address selecting unit for selectively transferring the address signal into the address comparing unit in a test mode so that the 1-bit repair address signal is outputted as the repair signal in the test mode.

2. The semiconductor memory device as recited in claim 1, wherein the repair address storing unit includes a fuse and outputs the repair address signal according to whether the fuse is blown or not.

3. The semiconductor memory device as recited in claim 1, further comprising an address latch unit for latching 1-bit address signal and outputting the 1-bit address signal to the address comparing unit.

4. The semiconductor memory device as recited in claim 1, wherein the address comparing unit activates the repair signal when the address signal is at a first level, and buffers the repair address signal and outputs the buffered repair address signal as the repair signal.

5. The semiconductor memory device as recited in claim 4, wherein the address comparing unit includes:
- a logic combining unit for combining a test signal activated in the test mode and the address signal of the first level and outputting an internal control signal;
- a signal transferring unit for transferring a driving voltage to an output terminal in response to the internal control signal so as to activate the repair signal; and
- a comparator circuit for activating the repair signal when the internal control signal is in an inactive state and the address signal and the repair address signal have the same level, and for buffering the repair signal to output the repair signal when the internal control signal is in an active state.

6. The semiconductor memory device as recited in claim 5, wherein the logic combination unit includes:
- a first inverter for inverting the address signal; and
- a NAND gate for receiving an output signal of the inverter and the test signal to output the internal control signal.

7. The semiconductor memory device as recited in claim 6, wherein the signal transferring unit includes a PMOS transistor having a gate receiving the internal control signal and transferring a power supply voltage to the output terminal.

8. The semiconductor memory device as recited in claim 7, wherein the comparator circuit includes:
- a second NAND gate receiving the internal control signal and the repair address signal;
- a second inverter for inverting an output signal of the NAND gate ND9;
- a transmission gate turned on in response to the output signal of the second NAND gate and the output signal of the second inverter to transfer the latched address signal to the output terminal;
- a second PMOS transistor having a gate receiving an address signal and one terminal connected to the power supply voltage;
- a third PMOS transistor having a gate receiving the output signal of the second NAND gate and one terminal connected to the other terminal of the second PMOS transistor;
- a first NMOS transistor having a gate receiving the output signal of the second inverter and one terminal connected to the other terminal of the third PMOS transistor; and
- a second NMOS transistor having a gate receiving the latched address signal, one terminal connected to the other terminal of the second NMOS transistor, and the other terminal connected to a ground voltage, wherein a common node of the third PMOS transistor and the first NMOS transistor is connected to the output terminal and the repair signal is outputted through the output terminal.

9. A semiconductor memory device comprising:
- a plurality of unit address detectors for comparing 1-bit address signal with a stored 1-bit repair address signal to output a repair signal, and for buffering the stored repair address signal and outputting the buffered repair address signal as the repair signal in a test mode;
- a redundancy address detector for combining the plurality of repair signals from the unit address detectors and outputting a detection signal for detecting whether a current input address is a redundancy address; and
- a redundancy flag signal generator for generating a redundancy flag signal in response to the detection signal and transferring the redundancy flag signal to a data output path.

10. The semiconductor memory device as recited in claim 9, wherein the unit address detector activates the repair signal if the address signal is at a first level while a test mode signal is activated and inputted in the test mode, and buffers the stored repair address signal to output the repair signal if the address signal is at a second level.

11. The semiconductor memory device as recited in claim 10, further comprising an address generator for inputting the address of the second level to one unit address selected among the plurality of unit address detectors and for inputting the address of the first level to the remaining unit address detectors.

12. The semiconductor memory device as recited in claim 11, wherein the unit address detector includes:
- a repair address storing unit for storing the repair address signal;
- an address latch for latching an inputted address;
- an address selecting unit for selectively transferring the latched address signal and the signal inputted from the address generator in response to a test address select signal; and
- an address comparing unit for comparing the output signal of the address selecting unit with the address signal stored in the address storing unit, and for outputting the stored address signal as the repair signal in the test mode.

13. The semiconductor memory device as recited in claim 12, wherein the address selecting unit includes:

a first transmission gate turned on in response to the inactive test address select signal to transfer the output signal of the address latch to the address comparing unit; and a second transmission gate turned on in response to the test address select signal to transfer the output signal of the address generator to the address comparing unit.

* * * * *